United States Patent
Martisauskas

(10) Patent No.: US 9,443,672 B2
(45) Date of Patent: Sep. 13, 2016

(54) PATTERNED CONDUCTIVE TRACES IN MOLDED ELASTOMERE SUBSTRATE

(75) Inventor: Steven J. Martisauskas, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 458 days.

(21) Appl. No.: 13/544,866

(22) Filed: Jul. 9, 2012

(65) Prior Publication Data

US 2014/0008196 A1   Jan. 9, 2014

(51) Int. Cl.

| H03K 17/975 | (2006.01) |
|---|---|
| H01H 13/702 | (2006.01) |
| H03K 17/955 | (2006.01) |
| H03K 17/96 | (2006.01) |
| H01H 13/704 | (2006.01) |
| H01H 3/12 | (2006.01) |

(52) U.S. Cl.
CPC ......... *H01H 13/702* (2013.01); *H01H 13/704* (2013.01); *H03K 17/955* (2013.01); *H03K 17/962* (2013.01); *H03K 17/975* (2013.01); *H01H 3/125* (2013.01); *H01H 2203/028* (2013.01); *H01H 2203/038* (2013.01); *H01H 2205/002* (2013.01); *H01H 2205/006* (2013.01); *H01H 2209/006* (2013.01); *H01H 2209/032* (2013.01); *H01H 2209/074* (2013.01); *H01H 2215/004* (2013.01); *H01H 2215/006* (2013.01)

(58) Field of Classification Search
CPC ............. H01H 13/702; H01H 13/704; H01H 2215/004; H01H 2215/008; H01H 2227/022; H03K 17/975; H03K 17/955; H03K 17/962
USPC .................................... 200/512, 600; 341/33
See application file for complete search history.

(56) References Cited

U.S. PATENT DOCUMENTS

| 5,483,261 A | 1/1996 | Yasutake |
| 5,488,204 A | 1/1996 | Mead et al. |
| 5,564,560 A * | 10/1996 | Minelli et al. ................. 200/516 |

(Continued)

FOREIGN PATENT DOCUMENTS

| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Felix O Figueroa
(74) *Attorney, Agent, or Firm* — Morrison & Foerster LLP

(57) ABSTRACT

Touch sensitive mechanical keyboards and processes for routing the drive and sense lines of the touch sensitive keyboard using patterned dome-switches are provided. The keyboard can include one or more mechanical keys having a touch sensor located within or beneath a keycap. The keyboard can further include a dome-switch beneath each keycap to detect a depression of the corresponding key. The dome-switch can be formed from an elastic (or malleable) material and can include patterned conductive traces within the elastic material. The patterned conductive traces can be used to route stimulation signals and sense signals to and from the touch sensor. In some examples, a first end of the patterned conductive traces can be coupled to the drive and sense lines of the touch sensor and a second end of the patterned conductive traces can be coupled to a flexible circuit or PCB.

17 Claims, 8 Drawing Sheets

(56) References Cited

U.S. PATENT DOCUMENTS

| | | |
|---|---|---|
| 5,825,352 A | 10/1998 | Bisset et al. |
| 5,835,079 A | 11/1998 | Shieh |
| 5,880,411 A | 3/1999 | Gillespie et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 8,479,122 B2 | 7/2013 | Hotelling et al. |
| 2006/0026521 A1 | 2/2006 | Hotelling et al. |
| 2006/0197753 A1 | 9/2006 | Hotelling |
| 2006/0239746 A1 | 10/2006 | Grant |
| 2010/0321298 A1 | 12/2010 | Tsai et al. |
| 2011/0100788 A1* | 5/2011 | Eck et al. ............... 200/61.93 |
| 2011/0186413 A1 | 8/2011 | Chen |
| 2012/0048706 A1 | 3/2012 | Jung et al. |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

PATENTED CONDUCTIVE TRACES IN MOLDED ELASTOMERE SUBSTRATE

FIELD

This relates generally to touch-sensitive input devices and, more specifically, to routing drive and sense lines of a touch-sensitive input device using patterned traces.

BACKGROUND

Keyboards are widely used and are generally accepted as the preferred way to provide textual input to a computing system. These keyboards typically have mechanical keys that are arranged in the so-called QWERTY layout and are configured to move independently of one another and comply with standards for key spacing and actuation force.

One of the most common keyboard types is a "dome-switch" keyboard that works as follows. When a key is depressed, the key pushes down on a rubber dome sitting beneath the key. The rubber dome collapses, giving tactile feedback to the user depressing the key, and causes a conductive contact on the underside of the dome to touch a pair of conductive lines on a Printed Circuit Board (PCB) below the dome, thereby closing the switch. A chip in the keyboard emits a scanning signal along the pairs of lines on the PCB to all the keys. When the signal in one pair of the lines changes due to the contact, the chip generates a code corresponding to the key connected to that pair of lines. This code is sent to the computer either through a keyboard cable or over a wireless connection where it is received and decoded into the appropriate key. The computer then decides what to do on the basis of the key depressed, such as display a character on the screen or perform some action. Other types of keyboards operate in a similar manner, with the main differences being how the individual key switches work. Some examples of other keyboards include capacitive-switch keyboards, mechanical-switch keyboards, Hall-effect keyboards, membrane keyboards, roll-up keyboards, and the like.

There have been numerous attempts made to introduce an alternative to the standard keyboard. The changes include, but are not limited to, non-QWERTY layouts, concave and convex surfaces, capacitive keys, split designs, membrane keys, etc. However, while such alternative keyboards may provide improved usability or ergonomics, they have failed to replace or duplicate the commercial success of the conventional mechanical keyboard.

SUMMARY

This relates to touch sensitive mechanical keyboards and processes for routing the drive and sense lines of the touch sensitive keyboard using patterned dome-switches. The keyboard can include one or more mechanical keys having a touch sensor located within or beneath a keycap. A touch sensor, as defined herein, can include a single touch region or node, or a plurality of touch regions or nodes, each touch region or node capable of detecting a touching object, or in some embodiments, a hovering object. The keyboard can further include a dome-switch beneath each keycap to detect a depression of the corresponding key. The dome-switch can be formed from an elastic (or malleable) material and can include patterned conductive traces within the elastic material. The patterned conductive traces can be used to route stimulation signals and sense signals to and from the touch sensor. In some examples, a first end of the patterned conductive traces can be coupled to the drive and sense lines of the touch sensor and a second end of the patterned conductive traces can be coupled to a flexible printed circuit or PCB.

DETAILED DESCRIPTION

In the following description of example embodiments, reference is made to the accompanying drawings in which it is shown by way of illustration specific embodiments that can be practiced. It is to be understood that other embodiments can be used and structural changes can be made without departing from the scope of the various embodiments.

This relates to touch sensitive mechanical keyboards and processes for routing the drive and sense lines of the touch sensitive keyboard using patterned dome-switches. The keyboard can include one or more mechanical keys having a touch sensor located within or beneath a keycap. The keyboard can further include a dome-switch beneath each keycap to detect a depression of the corresponding key. The dome-switch can be formed from an elastic (or malleable) material and can include patterned conductive traces within the elastic material. The patterned conductive traces can be used to route stimulation signals and sense signals to and from the touch sensor. In some examples, a first end of the patterned conductive traces can be coupled to the drive and sense lines of the touch sensor and a second end of the patterned conductive traces can be coupled to a flexible circuit or PCB. Using patterned conductive traces within the depressible domes to route the stimulation and touch signals obviates the need for separate circuitry that would otherwise be required to couple together the drive and sense lines of the touch sensor with the FPC layer. This advantageously simplifies the keyboard design and reduces the size of the keyboard.

While the examples described below relate to dome-switch keyboards, it should be appreciated that the present technology can similarly be applied to various components of other types of keyboards to route stimulation signals and sense signals to and from a touch sensor of the keyboard.

Figure 1:
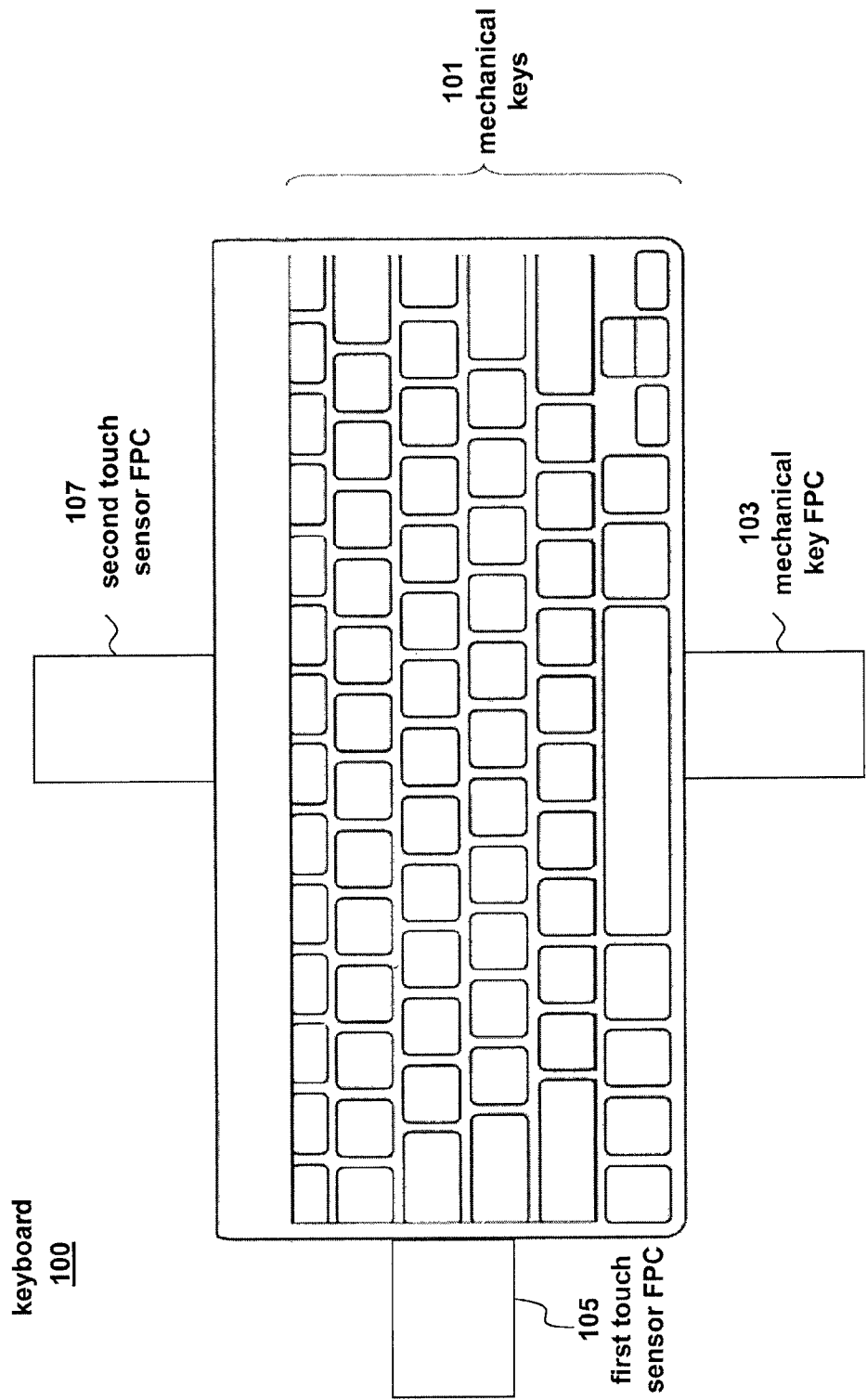
FIG. 1 illustrates a top view of an exemplary touch sensitive mechanical keyboard according to various embodiments.

FIG. 1 illustrates an exemplary touch sensitive mechanical keyboard 100 having mechanical keys 101 and a touch sensitive area located on at least a portion of the surfaces of mechanical keys 101. In some embodiments, keyboard 100 can be configured to have the look and feel of a conventional keyboard. For instance, each mechanical key 101 can be individually depressible, giving the user of keyboard 100 tactile feedback associated with each depression of a key.

Mechanical keys 101 can be used for text entry in a manner similar to a conventional keyboard. Furthermore, the touch sensitive area of keyboard 100 can be used to detect touch events (e.g., taps or slides) and hover events on or near the surface of mechanical keys 101. In this way, keyboard 100 can also be used for cursor input functions, such as point, click, scroll, drag, select, zoom, and the like, without requiring the user to remove their hands from the mechanical keys 101 of keyboard 100. These functions, and more, can be driven by hand/finger motion while the fingers are touching or hovering above mechanical keys 101. Moreover, the input of each of the user's hands, whether by key depressions, touch events, or hover events, can be processed independently. This allows the user to input textual data via key depressions or cursor input functions via touch events with one hand, while the other hand can separately and simultaneously input textual data via key depressions or cursor input functions via touch events.

In some embodiments, the touch sensitive area of keyboard 100 can include the surfaces of all mechanical keys 101. In other embodiments, the touch sensitive area can include the surfaces of only a portion of mechanical keys 101. By integrating multi-touch input capability into keyboard 100 without altering its overall appearance or, more importantly, the familiar way in which it is used for typing, many of the benefits of multi-touch gesture-based input capability can be realized without having a negative impact on the user's text entry experience.

In some embodiments, keyboard 100 can further include mechanical key flexible printed circuit (FPC) 103, first touch sensor FPC 105, and second touch sensor FPC 107 for coupling keyboard 100 to a processor or host computer system. For example, mechanical key FPC 103 can be used by keyboard 100 to output information relating to the depression of one or more of mechanical keys 101. Specifically, a signal indicating that one or more mechanical keys 101 have been depressed can be transmitted through mechanical key FPC 103 to a processor. Similarly, first and second touch sensor FPCs 105 and 107 can be used to output or receive information relating to a touch sensor included within keyboard 100. For example, in some embodiments, some or all mechanical keys 101 can include a touch sensor having multiple drive lines and multiple sense lines located within or beneath the key's keycap. In these embodiments, one of first touch sensor FPC 105 and second touch sensor FPC 107 can be used to receive stimulation signals for driving the drive lines while the other touch sensor FPC can be used to transmit touch signals received on the sense lines. In other embodiments, two or more of mechanical key FPC 103, first touch sensor FPC 105, and second touch sensor FPC 107 can be combined into a single FPC.

While specific examples of touch sensitive mechanical keyboard 100 are provided above, it should be appreciated that the principles described in the present disclosure can similarly be applied to touch sensitive mechanical keyboards having other features and configurations. For example, keyboards having non-QWERTY configurations and keyboards complying with ISO, ANSI, JIS, or other standards in extended or compact forms may also be used.

Figure 2:
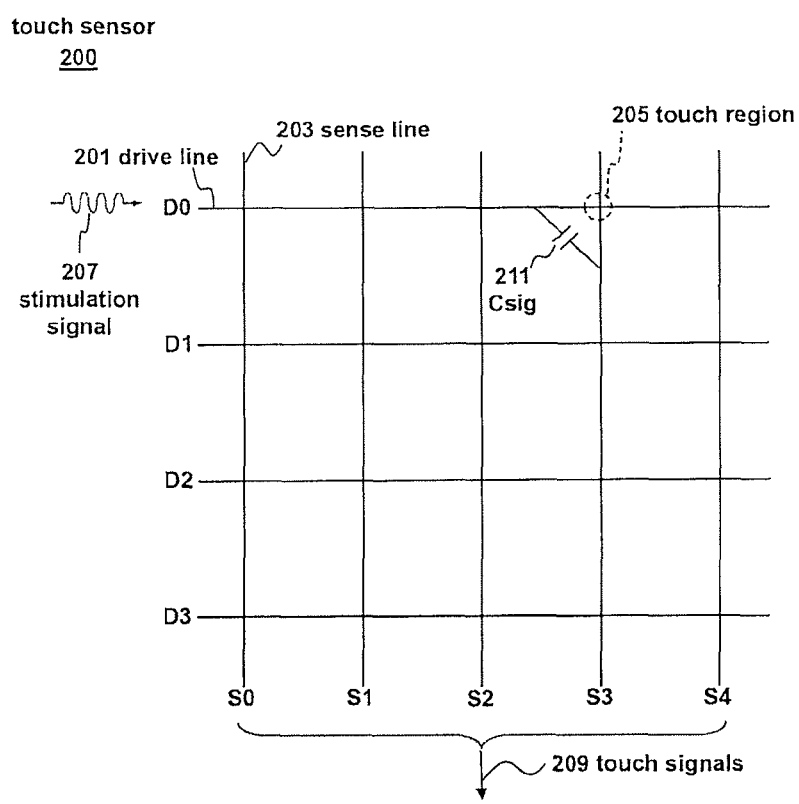
FIG. 2 illustrates an exemplary touch sensor panel that can be used with a touch sensitive mechanical keyboard according to various embodiments.

FIG. 2 illustrates touch sensor 200 that can be used to detect touch or hover events on or near a touch sensitive device, such as a keyboard, mobile phone, tablet, touchpad, portable computer, portable media player, or the like. In some embodiments, some or all mechanical keys 101 of keyboard 100 can include a touch sensor similar or identical to touch sensor 200. The touch sensor can be located within or beneath the keycaps of mechanical keys 101. The configuration of each key will be described in greater detail below with respect to FIGS. 3-6.

Touch sensor 200 can include an array of touch regions 205 that can be formed at the crossing points between rows of drive lines 201 (D0-D3) and columns of sense lines 203 (S0-S4). Each touch region 205 can have an associated mutual capacitance Csig 211 formed between the crossing drive lines 201 and sense lines 203 when the drive lines are stimulated. The drive lines 201 can be stimulated by stimulation signals 207 provided by drive circuitry (not shown) and can include an alternating current (AC) waveform. The sense lines 203 can transmit touch signals 209 indicative of a touch at the touch sensor 200 to sense circuitry (not shown), which can include a sense amplifier for each sense line, or a fewer number of sense amplifiers that can be multiplexed to connect to a larger number of sense lines.

To sense a touch at the touch sensor 200, drive lines 201 can be stimulated by the stimulation signals 207 to capacitively couple with the crossing sense lines 203, thereby forming a capacitive path for coupling charge from the drive lines 201 to the sense lines 203. The crossing sense lines 203 can output touch signals 209, representing the coupled charge or current. When a user's finger (or other object) touches the touch sensor 200, the finger can cause the capacitance Csig 211 to reduce by an amount ΔCsig at the touch location. This capacitance change ΔCsig can be caused by charge or current from the stimulated drive line 201 being shunted through the touching finger to ground rather than being coupled to the crossing sense line 203 at the touch location. The touch signals 209 representative of the capacitance change ΔCsig can be transmitted by the sense lines 203 to the sense circuitry for processing. The touch signals 209 can indicate the touch region where the touch occurred and the amount of touch that occurred at that touch region location.

While the embodiment shown in FIG. 2 includes four drive lines 201 and five sense lines 203, it should be appreciated that touch sensor 200 can include any number of drive lines 201 and any number of sense lines 203 to form the desired number and pattern of touch regions 205. Additionally, while the drive lines 201 and sense lines 203 are shown in FIG. 2 in a crossing configuration, it should be appreciated that other configurations are also possible to form the desired touch region pattern. While FIG. 2 illustrates mutual capacitance touch sensing, other touch sensing technologies may also be used in conjunction with embodiments of the disclosure, such as self-capacitance touch sensing, resistive touch sensing, projection scan touch sensing, and the like. Furthermore, while various embodiments describe a sensed touch, it should be appreciated that the touch sensor 200 can also sense a hovering object and generate hover signals therefrom.

Figure 3:
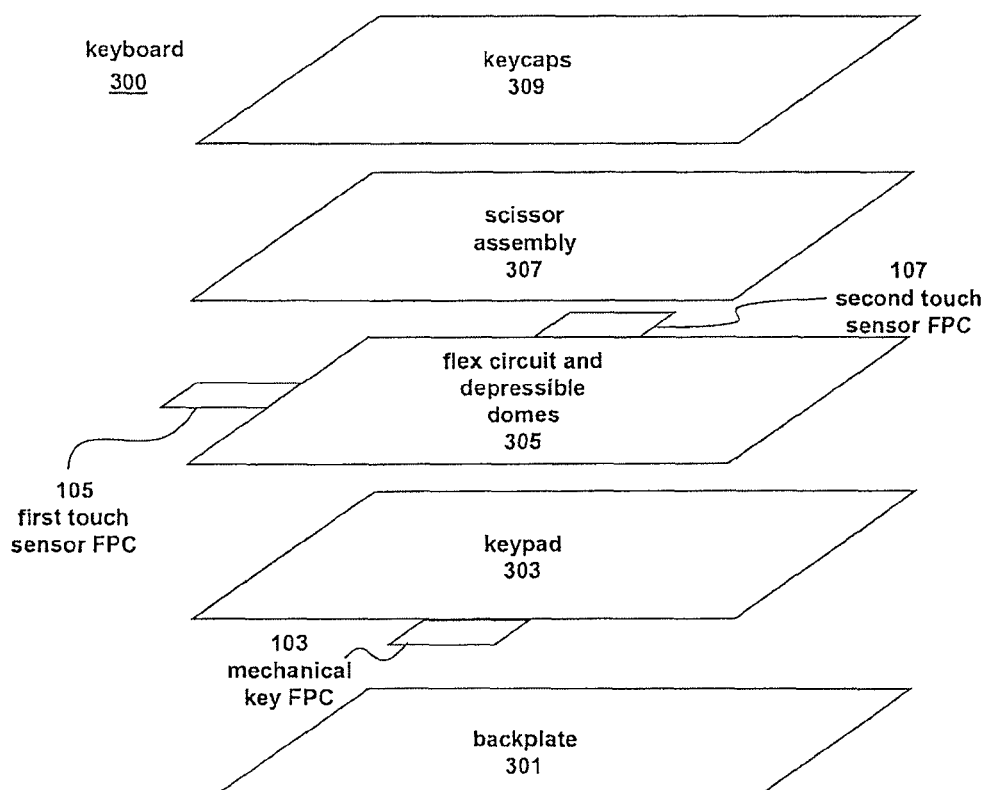
FIG. 3 illustrates an exploded view an exemplary touch sensitive mechanical keyboard according to various embodiments.

FIG. 3 illustrates an exploded view of an exemplary touch sensitive mechanical keyboard 300. Keyboard 300 is an example of touch sensitive mechanical keyboard 100 having one or more touch sensors similar or identical to touch sensor 200 for detecting touch events on the surface of some or all of the mechanical keys of keyboard 300.

Keyboard 300 can include backplate 301 for supporting the keyboard stack shown in FIG. 3. Backplate 301 can be formed from any rigid material, such as aluminum, steel, plastic, and the like. Keyboard 300 can further include keypad 303 for detecting a depression of one or more of the mechanical keys of keyboard 300. In some embodiments, keypad 303 can include a PCB having pairs of conductive traces that are configured to be coupled together in response to a depression of a depressible dome of flex circuit and depressible dome layer 305. The pairs of conductive traces in combination with the depressible domes can be used to detect a depression of one or more of the mechanical keys. Keyboard 300 can further include a processor (not shown) that emits a scanning signal along the pairs of lines on the PCB to all the keys. When the signal in one pair of the lines changes due to coupling by the switch, the processor can generate a code corresponding to the key connected to that pair of lines. This information can be transmitted through mechanical key FPC 103 to a processor or computing device, such as a laptop computer, desktop computer, mobile device, mobile phone, or the like.

In other embodiments, keypad 301 can detect depression of mechanical keys using other technologies, such as capacitive-switch circuitry, mechanical-switch circuitry, Hall-effect sensors, and the like. It should be appreciated that any known method for detecting depression of mechanical keys can be used.

Keyboard 300 can further include flex circuit and depressible dome layer 305. Layer 305 can include an FPC layer and one or more patterned depressible domes for routing stimulation and touch signals between processing circuitry (e.g., a processor, drive circuitry, sense circuitry, or combinations thereof) and one or more touch sensors located within keycap layer 309. The stimulation and touch signals can be similar or identical to stimulation signals 207 and touch signals 209, described above with respect to FIG. 2. In one embodiment, the FPC layer can include conductive traces (e.g., copper traces or other conventional trace material) configured to be coupled between first and second touch sensor FPCs 105 and 107 and a first set of bond pads where the conductive traces can be coupled to patterned conductive traces of the patterned depressible domes. In this way, the FPC layer can route stimulation signals received from the processing circuitry via first touch sensor FPC 105 (or second touch sensor FPC 107) to the first set of bond pads. Similarly, the FPC layer can route touch signals received from the first set of bond pads to the processing circuitry via second touch sensor FPC 107 (or first touch sensor FPC 105).

Layer 305 can further include one or more depressible domes made from an elastic, non-conductive material, such as rubber, elastomere, silicon, and the like. The depressible domes can be configured to collapse in response to a depression of a mechanical key of keyboard 300, providing tactile feedback to the user. Each depressible dome can further be configured to couple together pairs of conductive traces within keypad 303 in response to a depression of the depressible dome. Additionally, one or more of the depressible domes can include patterned conductive traces within the elastic material to route the stimulation and touch signals between the FPC layer and the touch sensors of keycap layer 309. The patterned conductive traces of the depressible dome can be formed from a conductive material, such as copper, nickel, gold, silver, and the like. The material used for the patterned conductive traces can be selected such that the material can withstand multiple depressions of the depressible dome. In some embodiments, a first end of the patterned conductive traces can be configured to be coupled to the conductive traces of the FPC layer at the first set of bond pads. The patterned conductive traces can be routed through the elastic material of the depressible dome to a second set of bond pads where they can be coupled to drive and sense lines of a touch sensor. In this way, the patterned conductive traces can route stimulation signals received from the FPC layer to the second set of bond pads. Similarly, the patterned conductive traces can route touch signals received from the second set of bond pads to the FPC layer at the first set of bond pads. The patterned conductive traces can be embedded within the elastic material as described herein using conventional manufacturing techniques known to those of ordinary skill in the art.

Keyboard 300 can further include scissor assembly layer 307 for providing the conventional depressible functionality of the mechanical keys. In some embodiments, scissor assembly layer 307 can include sets of two plastic pieces that interlock in a scissor-like fashion that can be coupled to keycaps within keycap layer 309. Such assemblies are known to those of ordinary skill in the art and any such assembly can be used.

Keyboard 300 can further include keycap layer 309. Keycap layer 309 can include multiple discrete keycaps forming the front surface of the mechanical keys of keyboard 300. The surface of the discrete keycaps can include printed or engraved letters, symbols, or numbers. When depressed, the keycaps can directly or indirectly contact the depressible domes of layer 305, thereby causing keypad 303 to detect the depression of the mechanical keys. In some embodiments, one or more of the keycaps can include a touch sensor for detecting touch events on the surface of the mechanical keys. The touch sensor can be similar or identical to touch sensor 200 and can be integrated within each keycap or can be applied to the undersurface of each keycap using an adhesive layer, such as pressure sensitive adhesive (PSA).

In some embodiments, the touch sensors of the keycaps can include clusters of intersecting drive lines and sense lines forming sensor nodes similar to drive lines 201, sense lines 203, and touch regions 205 of touch sensor 200 shown in FIG. 2. Each keycap can have associated therewith any number of sensor nodes depending on the desired touch resolution. For example, the drive lines and sense lines can form a grid beneath each keycap to detect touch events along the surface of keycaps.

In some embodiments, the drive lines and sense lines of the keycap touch sensors can be coupled to the patterned conductive traces of the depressible domes at the second set of bond pads. In this way, the touch sensors of the keycaps can be coupled to first and second touch sensor FPCs 105 and 107 via the patterned conductive traces of the depressible domes and the FPC layer of layer 305. For example, one of first touch sensor FPC 105 and second touch sensor FPC 107 can be used to receive stimulation signals for driving the drive lines of the touch sensors. The stimulation signal can then be routed through the FPC layer of layer 305 to the first set of bond pads, where they can be routed to the patterned conductive traces of the depressible domes. The stimulation signal can then be routed through the elastic material of the depressible domes via the patterned conductive traces to the second set of bond pads, where they can be routed to the drive lines of the touch sensors. The touch signals can be routed in a similar manner from the touch sensor to the other FPC of the first touch sensor FPC 105 and second touch sensor FPC 107.

Using patterned conductive traces within the depressible domes to route the stimulation and touch signals obviates the need for separate circuitry that would otherwise be required to couple together the drive and sense lines of the touch sensor with the FPC layer. This advantageously simplifies the keyboard design and reduces the size of the keyboard.

Figure 4:
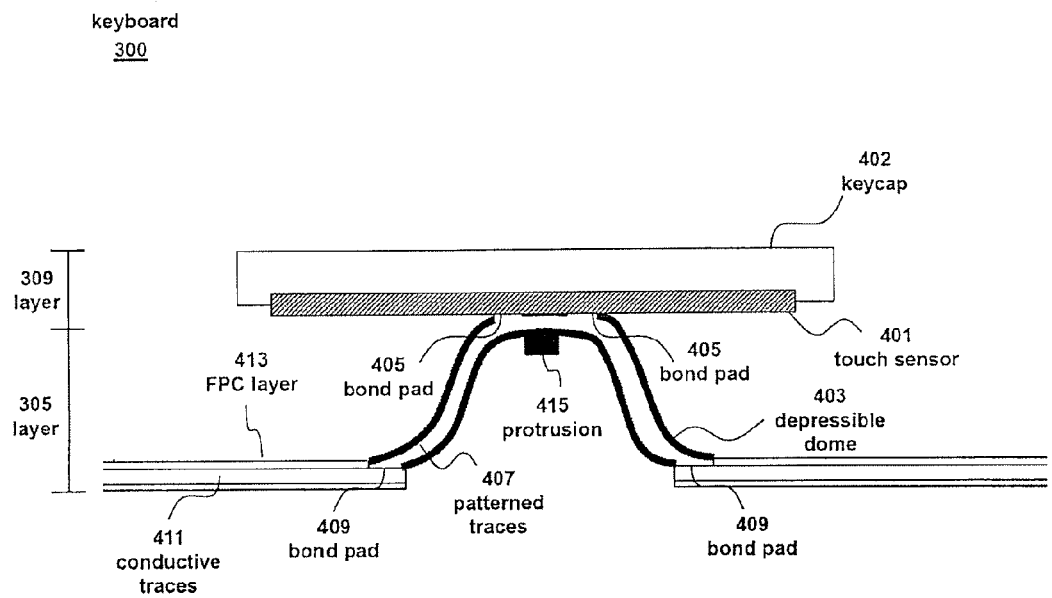
FIG. 4 illustrates a cross-sectional view of a portion of an exemplary touch sensitive mechanical keyboard according to various embodiments.

FIG. 4 illustrates a cross-sectional view of keycap layer 309 and layer 305 of keyboard 300. For simplicity and clarity, scissor assembly 307, keypad 303, and backplate 301 are not shown. As illustrated in FIG. 4, keycap layer 309 can include keycap 402 and touch sensor 401. Touch sensor 401 can be located beneath or within keycap 402 and can be used for detecting touch or hover events on the keycap 402 surface. Touch sensor 401 can be similar or identical to touch sensor 200, described above. While touch sensor 401 is shown beneath keycap 402, in other examples, touch sensor 401 can be located within keycap 402.

Beneath keycap layer 309 is layer 305. Layer 305 can include depressible dome 403 and FPC 413. Depressible dome 403 can be formed using an elastic material (represented by the bold black lines), such as rubber, elastomere, silicon, and the like. Depressible domes 403 can further include patterned traces 407 (represented by the white area between the bold black lines) within the elastic material. In some embodiments, one or more portions of the elastic material of depressible dome 403 can be removed in order to expose a portion of patterned traces 407. For example, portions of the elastic material of depressible dome 403 can be removed to form a second set of bond pads 405 to allow patterned traces 407 to be coupled to the drive and sense lines of touch sensor 401. In this example, since depressible dome 403 and bond pads 405 are located near the center of touch sensor 401, the ends of the drive and sense lines of touch sensor 401 can be routed down toward the center of the touch sensor such that the drive and sense lines can be coupled to patterned traces 407 of depressible dome 403 at the second set of bond pads 405. For example, the upper portion of touch sensor 401 can include drive and sense lines patterned in a configuration similar to that shown in FIG. 2. However, to route these lines to the second set of bond pads 405, the ends of the drive and sense lines may be routed down to a bottom portion of touch sensor 401 and then routed toward the center of touch sensor 401 to be coupled to patterned traces 407 at the second set of bond pads 405.

Depressible dome 403 can further include conductive protrusion 415 on an underside of the dome to couple together pairs of conductive traces of keypad 303 (not shown). For example, in response to a depression of depressible dome 403, conductive protrusion 415 can contact keypad 303 located below depressible dome 403 to complete a circuit formed by the pair of conductive traces.

Keyboard 300 can further include FPC 413 located beneath depressible dome 403. FPC 413 can include upper and lower insulating layers that enclose conductive traces 411. Portions of the insulating layer of FPC 413 can be removed such that conductive traces 411 can couple with patterned traces 407 at the first set of bond pads 409. In this example, portions of the elastic material of depressible dome 403 can also be removed to expose portions of patterned traces 407 to be coupled to conductive traces 411 at the first set of bond pad 409. In this way, stimulation and sense signals can be routed to and from touch sensor 401 via patterned traces 407 and conductive traces 411. In some embodiments, patterned traces 407 can be enclosed within the elastic material in areas located away from first and second bond pads 409 and 405.

Figure 5:
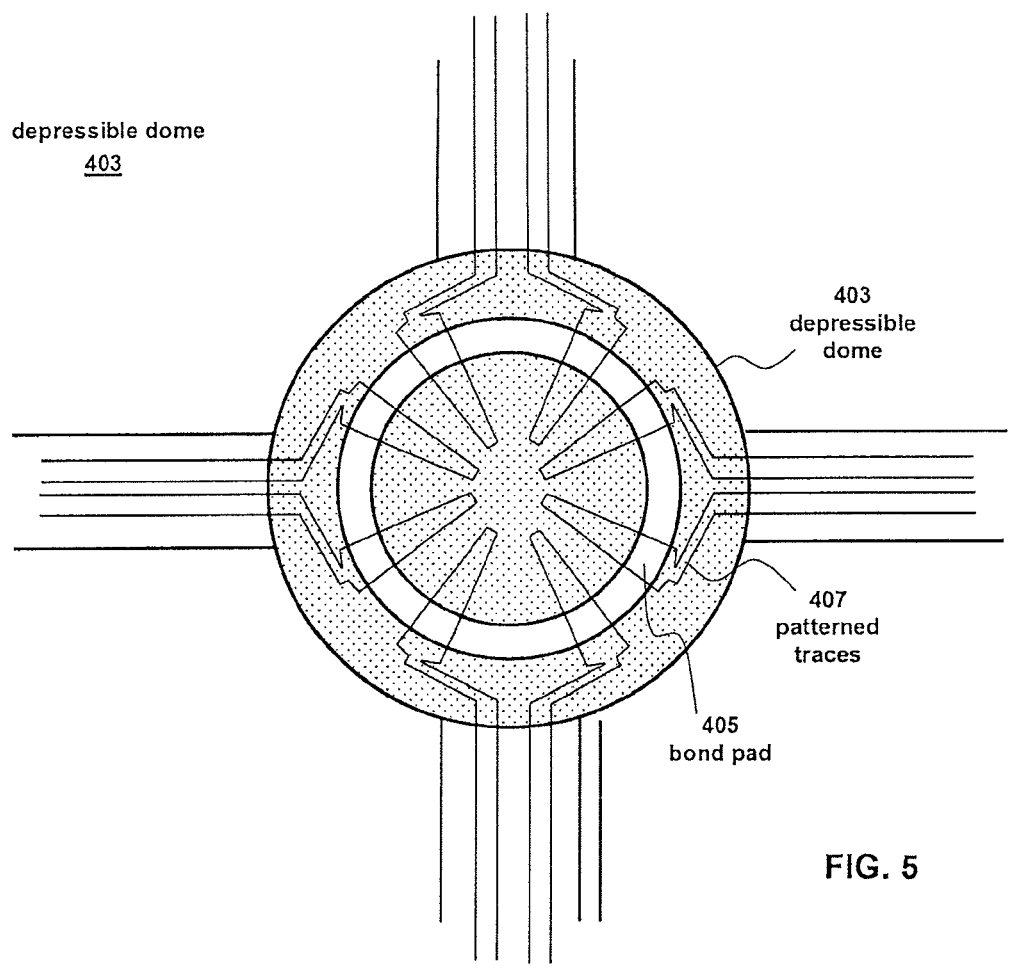
FIG. 5 illustrates a top-view of an exemplary depressible dome of a touch sensitive mechanical keyboard according to various embodiments.

FIG. 5 illustrates a top view of depressible dome 403. As shown in FIG. 5, depressible dome 403 includes multiple patterned traces 407 routed through the elastic material (represented by the dotted area) of the dome. In the illustrated example, the elastic material covers the side and top-center surfaces of depressible dome 403. A ring of elastic material (represented by the white area) can be removed near the center of depressible dome 403, forming the second set of bond pads 409 for allowing patterned traces 407 to be exposed and coupled to the drive and sense lines of touch sensor 401. While eight patterned traces 407 are shown, it should be appreciated that depressible dome 403 can include any number of patterned traces 407 arranged in any desired configuration.

Figure 6:
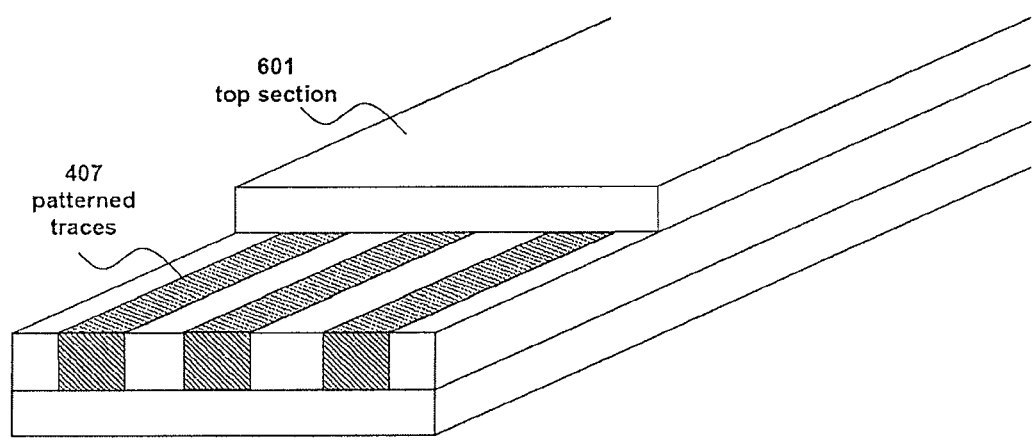
FIG. 6 illustrates a cross-sectional view of a portion of an exemplary depressible dome according to various embodiments.

FIG. 6 illustrates a cross-sectional view of a portion of depressible dome 403. Specifically, FIG. 6 illustrates a portion of depressible dome 403 at the second set of bond pads 405. A portion of the top section 601 of elastic material (represented by the white areas) of depressible dome 403 can be removed, thereby exposing portions of patterned traces 407 (represented by the hashed areas). In this way, the drive and sense lines of touch sensor 401 can be coupled to patterned traces 407 at the second set of bond pads 405, while insulating other portions of patterned traces 407 using the elastic material. A similar configuration of elastic material can be used for depressible dome 403 at the first set of bond pads 409.

Figure 7:
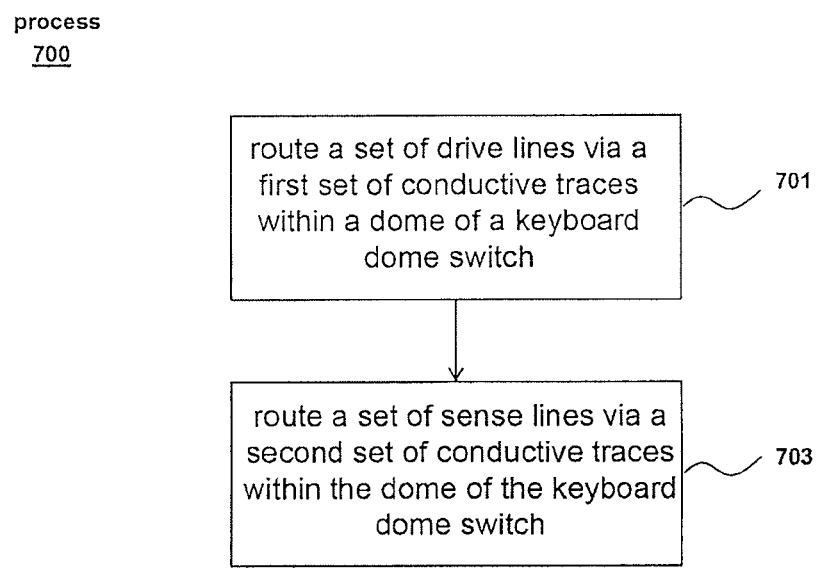
FIG. 7 illustrates an exemplary process for routing drive and sense lines via patterned traces within a depressible dome according to various embodiments.

FIG. 7 shows an exemplary process 700 for routing a set of drive lines and a set of sense lines from a touch sensor using patterned conductive traces within a keyboard dome-switch. At block 701, a set of drive lines of the touch sensor can be routed via a first set of traces within a dome of a keyboard dome-switch. In some embodiments, the first set of conductive traces can be used to route the drive lines to a flexible circuit, where the drive lines can be further routed to processing circuitry. In some embodiments, the touch sensor can be similar or identical to touch sensor 401, the flexible circuit can be similar or identical to FPC 413, and the first set of traces can include traces similar or identical to patterned traces 407 of depressible dome 403.

At block 703, a set of sense lines of the touch sensor can be routed via a second set of traces within the dome of the keyboard dome-switch. In some embodiments, the second set of conductive traces can be used to route the sense lines to the flexible circuit, where the sense lines can be further routed to processing circuitry. In some embodiments, the touch sensor can be similar or identical to touch sensor 401, the flexible circuit can be similar or identical to FPC 413, and the second set of traces can include traces similar or identical to patterned traces 407 of depressible dome 403.

Figure 8:
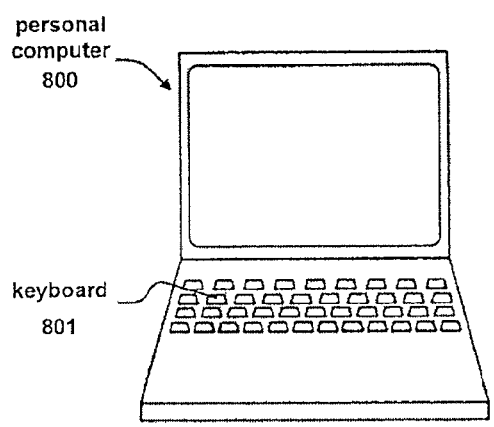
FIG. 8 illustrates an exemplary personal computer including an input device according to various embodiments.

FIG. 8 illustrates an exemplary personal computer 800 that can include a touch sensitive mechanical keyboard 801 according to various embodiments.

Figure 9:
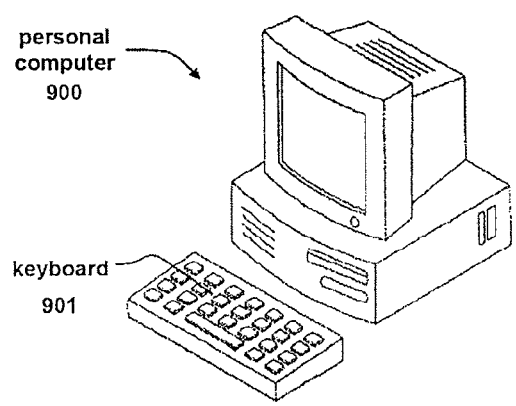
FIG. 9 illustrates another exemplary personal computer including an input device according to various embodiments.

FIG. 9 illustrates another exemplary personal computer 900 that can include a touch sensitive mechanical keyboard 901 according to various embodiments.

The personal computers of FIGS. 8 and 9, as well as other computing devices, can receive both touch input and mechanical key input by utilizing a touch sensitive mechanical keyboard according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A dome for a dome-switch, the dome comprising:
a conductive protrusion configured for performing a switching function of the dome switch; and
a plurality of conductive traces at least partially embedded within a malleable material, wherein a first end of each of the plurality of conductive traces is exposed at a first surface of the material, and wherein a second end of each of the plurality of conductive traces is exposed at a second surface of the material,
the plurality of conductive traces comprising a first set of conductive traces and a second set of conductive traces configured for routing a set of drive lines and a set of sense lines for a capacitive touch sensor, wherein the first set of conductive traces is coupled to the set of drive lines of the capacitive touch sensor, and wherein the second set of conductive traces is coupled to the set of sense lines of the capacitive touch sensor.

2. The dome of claim 1, wherein the plurality of conductive traces comprises copper, nickel, gold, or silver.

3. The dome of claim 1, wherein the malleable material comprises elastomere.

4. The dome of claim 1, wherein the dome switch is included within a touch sensitive mechanical keyboard.

5. A keyboard dome-switch comprising:
a depressible dome, wherein the depressible dome includes a conductive protrusion that is operable to couple together two conductive traces in response to a depression of the dome; and
a plurality of conductive traces at least partially embedded within the dome and configured for routing a set of drive lines and a set of sense lines for a capacitive touch sensor, the plurality of conductive traces comprising a first set of conductive traces and a second set of conductive traces, wherein the first set of conductive traces is coupled to the set of drive lines of the capacitive touch sensor, and wherein the second set of conductive traces is coupled to the set of sense lines of the capacitive touch sensor.

6. The keyboard dome-switch of claim 5, wherein the depressible dome further comprises a capacitive touch sensor.

7. The keyboard dome-switch of claim 5, wherein the depressible dome comprises a malleable material, and wherein the plurality of conductive traces are at least partially embedded within the malleable material.

8. The keyboard dome-switch of claim 7, wherein a first portion of the plurality of conductive traces are exposed, forming a first set of bond pads, and wherein a second portion of the plurality of conductive traces are exposed, forming a second set of bond pads.

9. The keyboard dome-switch of claim 8, wherein the first set of bond pads is located at a first end of the plurality of conductive traces, and wherein the second set of bond pads is located at a second end of the plurality of conductive traces.

10. A keyboard comprising:
a keycap comprising a capacitive touch sensor;
a printed circuit; and
a dome-switch comprising:
a dome including a conductive protrusion configured for performing a switching function of the dome-switch; and
a plurality of conductive traces at least partially embedded within the dome and coupled between the capacitive touch sensor and the printed circuit and configured for routing a set of drive lines and a set of sense lines for the capacitive touch sensor, the plurality of conductive traces comprising a first set of conductive traces and a second set of conductive traces, wherein the first set of conductive traces is coupled to the set of drive lines of the capacitive touch sensor, and wherein the second set of conductive traces is coupled to the set of sense lines of the capacitive touch sensor.

11. The keyboard of claim 10, wherein the capacitive touch sensor is located on a surface of the keycap.

12. The keyboard of claim 10, wherein the capacitive touch sensor is located within the keycap.

13. The keyboard of claim 10, wherein the printed circuit comprises one of a printed circuit board and a flexible printed circuit.

14. The keyboard of claim 10, wherein the printed circuit is further coupled to processing circuitry operable to generate a stimulation signal and process a touch signal from the capacitive touch sensor.

15. The keyboard of claim 10, wherein a first end of the plurality of conductive traces are coupled to the printed circuit at a first set of bond pads, and wherein a second end of the plurality of conductive traces are coupled to the touch sensor at a second set of bond pads.

16. The keyboard of claim 15, wherein a first portion of the plurality of conductive traces are exposed from the dome at the first set of bond pads, and wherein a second portion of the plurality of conductive traces are exposed from the dome at the second set of bond pads.

17. The keyboard of claim 15, wherein a third portion of the plurality of conductive traces are embedded within a side surface of the dome, wherein the side surface of the dome excludes the first set of bond pads and the second set of bond pads.

* * * * *